US010920318B2

(12) United States Patent
Noguchi et al.

(10) Patent No.: US 10,920,318 B2
(45) Date of Patent: Feb. 16, 2021

(54) SHOWER PLATE, SEMICONDUCTOR MANUFACTURING APPARATUS, AND METHOD FOR MANUFACTURING SHOWER PLATE

(71) Applicant: KYOCERA CORPORATION, Kyoto (JP)

(72) Inventors: Yukio Noguchi, Kyoto (JP); Yuuji Kawase, Kyoto (JP); Hiromasa Matsufuji, Kyoto (JP); Kouji Teramoto, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 214 days.

(21) Appl. No.: 15/771,525

(22) PCT Filed: Oct. 27, 2016

(86) PCT No.: PCT/JP2016/081907
§ 371 (c)(1),
(2) Date: Apr. 27, 2018

(87) PCT Pub. No.: WO2017/073679
PCT Pub. Date: May 4, 2017

(65) Prior Publication Data
US 2018/0312974 A1 Nov. 1, 2018

(30) Foreign Application Priority Data
Oct. 30, 2015 (JP) .................... 2015-214085

(51) Int. Cl.
C23C 16/455 (2006.01)
C04B 37/00 (2006.01)
(Continued)

(52) U.S. Cl.
CPC ........ *C23C 16/45565* (2013.01); *B28B 11/12* (2013.01); *B28B 11/243* (2013.01);
(Continued)

(58) Field of Classification Search
CPC ............ C23C 16/45565; C04B 37/005; C04B 35/62695; C04B 35/111; C04B 35/117;
(Continued)

(56) References Cited

U.S. PATENT DOCUMENTS 7,270,713 B2 * 9/2007 Blonigan .............. C23C 16/455
118/715
2014/0283995 A1 * 9/2014 Tanaka .................. C04B 35/443
156/345.33

FOREIGN PATENT DOCUMENTS

JP 2000228366 A 8/2000
JP 2003133237 A 5/2003
(Continued)

*Primary Examiner* — Rudy Zervigon
(74) *Attorney, Agent, or Firm* — Viering, Jentschura & Partner MBB

(57) ABSTRACT

A shower plate according to the present disclosure includes a ceramic sintered body, the ceramic sintered body comprising a first surface, a second surface facing the first surface, and a through hole positioned between the first surface and the second surface. An inner surface of the through hole includes a protruding crystal grain which protrudes more than an exposed part of a grain boundary phase existing between crystal grains. In addition, a semiconductor manufacturing apparatus according to the present disclosure includes the shower plate mentioned above.

8 Claims, 7 Drawing Sheets

(51) Int. Cl.
  *C04B 35/626* (2006.01)
  *B28B 11/12* (2006.01)
  *C04B 35/111* (2006.01)
  *B28B 11/24* (2006.01)
  *C04B 35/117* (2006.01)
  *C04B 35/64* (2006.01)
  *H01L 21/67* (2006.01)

(52) U.S. Cl.
  CPC ........... *C04B 35/111* (2013.01); *C04B 35/117* (2013.01); *C04B 35/62695* (2013.01); *C04B 35/64* (2013.01); *C04B 37/003* (2013.01); *C04B 37/005* (2013.01); *H01L 21/67069* (2013.01); C04B 2235/3201 (2013.01); C04B 2235/3206 (2013.01); C04B 2235/3208 (2013.01); C04B 2235/3213 (2013.01); C04B 2235/3217 (2013.01); C04B 2235/3418 (2013.01); C04B 2235/442 (2013.01); C04B 2235/5436 (2013.01); C04B 2235/5445 (2013.01); C04B 2235/5472 (2013.01); C04B 2235/612 (2013.01); C04B 2235/77 (2013.01); C04B 2235/783 (2013.01); C04B 2235/785 (2013.01); C04B 2235/786 (2013.01); *C04B 2235/945* (2013.01); *C04B 2237/343* (2013.01); *C04B 2237/62* (2013.01); *C04B 2237/64* (2013.01)

(58) Field of Classification Search
  CPC . C04B 35/64; C04B 37/003; C04B 2235/945; C04B 2235/3201; C04B 2235/77; C04B 2235/5472; C04B 2235/3206; C04B 2235/3213; C04B 2235/5445; C04B 2235/3208; C04B 2235/5436; C04B 2235/3217; C04B 2235/3418; C04B 2235/442; C04B 2235/612; C04B 2235/783; C04B 2235/785; C04B 2235/786; C04B 2237/343; C04B 2237/62; C04B 2237/64; B28B 11/12; B28B 11/243; H01L 21/67069
  USPC ...................................... 118/715; 156/345.1
  See application file for complete search history.

(56) References Cited

FOREIGN PATENT DOCUMENTS

| | | |
|---|---|---|
| JP | 2005026593 A | 1/2005 |
| JP | 2008208000 A | 9/2008 |
| JP | 2014049685 A | 3/2014 |

\* cited by examiner

SHOWER PLATE, SEMICONDUCTOR MANUFACTURING APPARATUS, AND METHOD FOR MANUFACTURING SHOWER PLATE

CROSS-REFERENCE TO RELATED APPLICATIONS

This application is a national stage entry according to 35 U.S.C. 371 of PCT Application No. PCT/JP2016/081907 filed on Oct. 27, 2016, which claims priority to Japanese Application No. 2015-214085 filed on Oct. 30, 2015, which are entirely incorporated herein by reference.

TECHNICAL FIELD

The present disclosure relates to a shower plate, a semiconductor manufacturing apparatus, and a method for manufacturing a shower plate.

BACKGROUND ART

Conventionally, a semiconductor manufacturing apparatus such as a CVD apparatus or a dry etching apparatus has been used in a semiconductor manufacturing process. The CVD apparatus forms a thin film of α-Si (amorphous silicon), SiOx (silicon oxide), SiNx (silicon nitride), or the like on the surface of a wafer by supplying a fluorine-based or chlorine-based corrosive gas to the wafer and the dry etching apparatus etches the surface of a wafer. Such a semiconductor manufacturing apparatus forms a film on the surface of a wafer or etches a thin film formed on the surface of a wafer by applying a high-frequency voltage across a shower plate which introduces a corrosive gas to the wafer and a sample stage on which the wafer is placed to generate plasma.

For example, a CVD apparatus 200 illustrated in FIG. 10 has a chamber 200A, a sample stage 205 is provided in the lower part of the chamber 200A, and a shower plate 201 to which a gas pipe 209 is connected is provided in the upper part of the chamber 200A. FIG. 11A is a plan view illustrating the shower plate 201 and FIG. 11B is a cross sectional view illustrating the shower plate 201. The shower plate 201 has a plurality of through holes 203 through which a corrosive gas is introduced, as illustrated in FIGS. 11A and 11B.

Japanese Unexamined Patent Application JP-A 2003-133237 (Patent Literature 1) describes a shower plate having the above structure in which through holes of the shower plate are formed by boring with a drill or machine work which bores the holes by supplying free abrasive particles while applying ultrasonic vibrations to a tool.

FIG. 12 is an enlarged schematic view illustrating a cross section of an inner surface of a through hole formed by machine work. When a through hole is formed by such machine work, many micro cracks 202c are present on the surfaces of crystal grains 202 on the inner surface of the through hole. When many micro cracks 202c described above are present, if the micro cracks 202c are developed and connected to grain boundary phases or the micro cracks 202c are connected to each other, grains are removed (grain removal) from the inner surface to form particles, possibly causing particle pollution. Now, there is a need for a shower plate which further suppresses the generation of particles from the inner surface of a through hole.

SUMMARY OF INVENTION

A shower plate according to the present disclosure comprises a ceramic sintered body comprising a first surface, a second surface facing the first surface, and a through hole positioned between the first surface and the second surface. An inner surface of the through hole comprises a protruding crystal grain which protrudes more than an exposed part of a grain boundary phase existing between crystal grains.

In addition, a semiconductor manufacturing apparatus according to the present disclosure comprises the shower plate having the above structure.

In addition, in a method for manufacturing the shower plate according to the present disclosure, granules are obtained by granulating a slurry containing ceramic powder. Next, there is obtained a first molded body including an A surface which becomes a first surface, a B surface which faces the A surface and becomes a second surface, and a through hole formed between the A surface and the B surface. Next, the first molded body is fired to obtain a ceramic sintered body. Then, this manufacturing method does not apply machine work to an inner surface of the through hole after firing.

BRIEF DESCRIPTION OF DRAWINGS

FIGS. 1A and 1B illustrate an example of a shower plate according to a first embodiment, wherein FIG. 1A is a plan view, and FIG. 1B is a cross sectional view taken along the line A-A' in FIG. 1A;

FIGS. 5A and 5B illustrate an example of a shower plate according to a second embodiment, wherein FIG. 5A is a plan view, and FIG. 5B is a cross sectional view taken along the line B-B' in FIG. 5A;

FIGS. 6A and 6B are drawings for explaining a method for manufacturing the shower plate according to the second embodiment, wherein FIG. 6A is a plan view of a second molded body after molding and FIG. 6B is a cross sectional view taken along the line C-C' in FIG. 6A;

FIGS. 7A and 7B are drawings for explaining the method for manufacturing the shower plate according to the second embodiment, wherein FIG. 7A is a plan view illustrating the second molded body in which grooves have been formed and FIG. 7B is a cross sectional view taken along the line D-D' in FIG. 7A;

FIGS. 8A and 8B are drawings for explaining the method for manufacturing the shower plate according to the second embodiment, wherein FIG. 8A is a plan view illustrating the second molded body in which through holes have been formed and FIG. 8B is a cross sectional view taken along the line E-E' in FIG. 8A;

FIGS. 11A and 11B illustrate an example of the conventional shower plate, wherein FIG. 11A is a plan view, and FIG. 11B is a cross sectional view taken along the line F-F' in FIG. 11A.

DESCRIPTION OF EMBODIMENTS

Figure 1A:
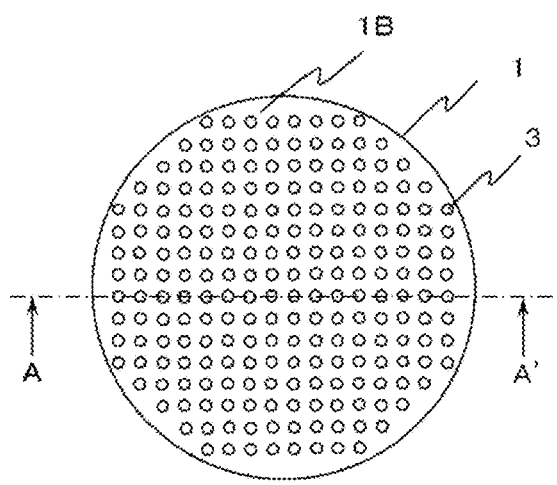

Embodiments of the disclosure will be described in detail below with reference to the drawings. In all drawings of this specification, the same components are denoted by the same reference numerals to omit the description thereof as appropriate unless there is confusion.

First Embodiment

Figure 1B:
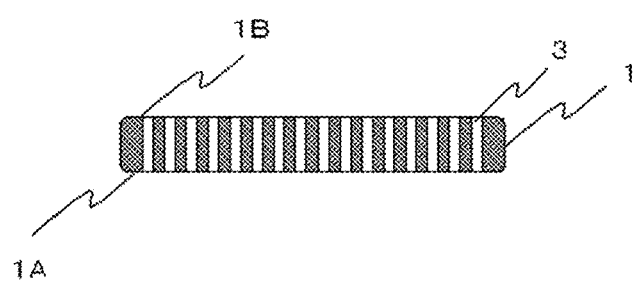
Figure 2:
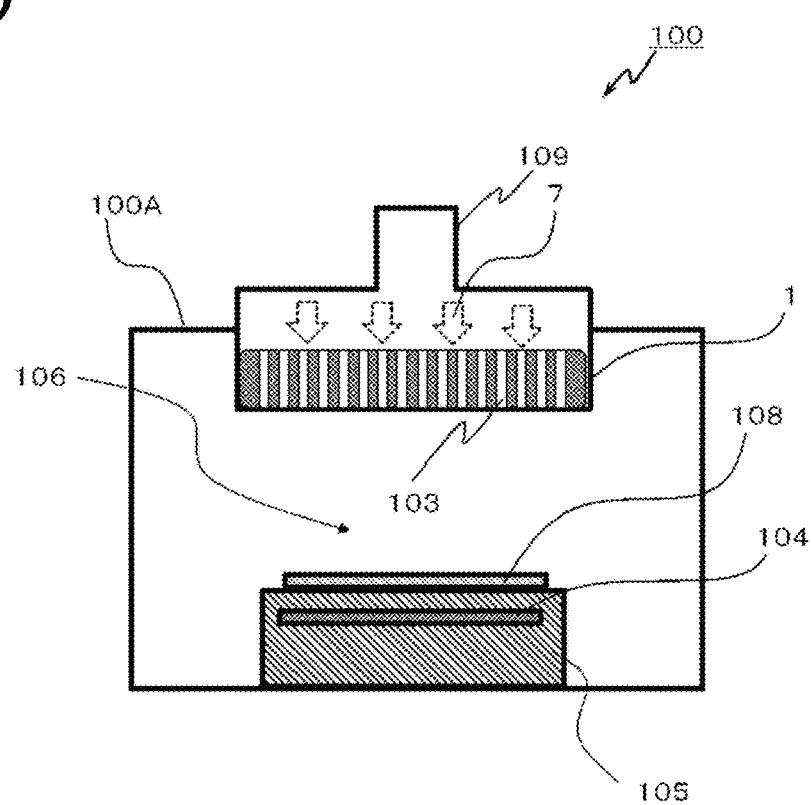
FIG. 2 is a schematic view illustrating an example of a CVD apparatus having the shower plate illustrated in FIGS. 1A and 1B.

FIGS. 1A and 1B illustrate an example of a shower plate according to a first embodiment, wherein FIG. 1A is a plan view, and FIG. 1B is a cross sectional view taken along the line A-A' in FIG. 1A. FIG. 2 is a schematic view illustrating an example of a CVD apparatus having the shower plate illustrated in FIGS. 1A and 1B.

A shower plate 1 illustrated in FIGS. 1A and 1B comprises a ceramic sintered body, the ceramic sintered body comprising a first surface 1A, a second surface 1B facing the first surface, and a plurality of through holes 3 through which a fluid such as a corrosive gas passes.

The shower plate 1 is used in, for example, a CVD apparatus 100 which is a semiconductor manufacturing apparatus illustrated in FIG. 2. The CVD apparatus 100 has a chamber 100A and a sample stage 105 having a heater 104 is disposed on a lower side of the chamber 100A. In addition, the shower plate 1 to which a gas pipe 109 is connected is disposed on an upper side of the chamber 100A.

When a thin film is formed on, for example, a wafer 108 using the CVD apparatus 100, the wafer 108 is first placed on the sample stage 105. Then, a vacuum atmosphere is created in the chamber 100A and the heater 104 in the sample stage 105 is energized to raise the temperature of the sample stage 105. After the temperature of the wafer 108 rises to a predetermined temperature, a corrosive gas 7 is supplied through the gas pipe 109. The corrosive gas 7 passes through through holes 103 of the shower plate 1 and is supplied to the space (reaction space 106) between the shower plate 1 and the sample stage 105. Then, a high-frequency voltage is applied in this state to generate plasma in the reaction space 106 and reaction products of the corrosive gas 7 by the plasma are deposited on the surface of the wafer 108, and thereby a thin film can be formed on the surface of the wafer 108.

The corrosive gas 7 may be, for example, a fluorine-based gas such as $SF_6$, $CF_4$, $CHF_3$, $ClF_3$, $NF_3$, $C_4F_8$, or HF, or a chlorine-based gas such as $Cl_2$, HCl, $BCl_3$, or $CCl_4$.

The shower plate 1 may comprise a ceramic sintered body containing, for example, aluminum oxide, yttrium oxide, or YAG (yttrium aluminum garnet) as a main component. The main component occupies 80 mass % or more with respect to 100 mass % of all components constituting the ceramic sintered body. For example, in the ceramic sintered body containing aluminum oxide as the main component, the content of aluminum oxide is 80 mass % or more with respect to 100 mass % of all components constituting the ceramic sintered body.

The main component of the ceramic sintered body can be determined by the method described below. First, the components of the ceramic sintered body are identified using an X-ray diffractometer (XRD). Next, the content of each component is determined using a fluorescent X-ray analyzer (XRF) or an ICP (Inductively Coupled Plasma) emission spectrophotometric analyzer (ICP). For example, when inclusion of aluminum oxide is identified by an XRD and a value converted from the content of aluminum measured by an XRF or ICP into the content of aluminum oxide is 80 mass % or more, the ceramic sintered body contains aluminum oxide as the main component.

Figure 3:
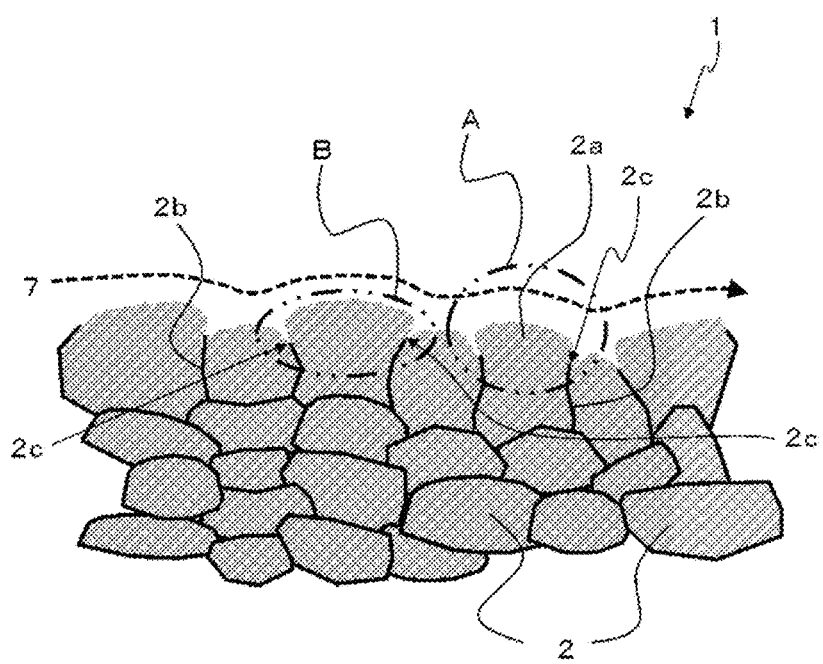
FIG. 3 is an enlarged schematic view of a cross section of an inner surface of a through hole of the shower plate illustrated in FIGS. 1A and 1B.

FIG. 3 is an enlarged schematic view of a cross section of an inner surface of a through hole 3 of the shower plate 1 illustrated in FIGS. 1A and 1B and illustrates an example of a cross section taken along a plane passing through the center line of the through hole 3. Although not illustrated in FIG. 3, the center line of the through hole 3 is positioned on an upper side in FIG. 3. In the shower plate 1 of the embodiment, the inner surface of the through hole 3 comprises a protruding crystal grain 2a which protrudes more than an exposed part 2c of a grain boundary phase 2b existing between crystal grains 2.

As illustrated in an A region surrounded by a two-dot chain line in FIG. 3, the protruding crystal grain 2a protrudes toward the center (upper side in the drawing) of the through hole 3 more than the exposed parts 2c of the grain boundary phases 2b existing on both sides of the protruding crystal grain 2a on the inner surface of the through hole 3. "The protruding crystal grain 2a protrudes" means that, when a vertical line is drawn between the center line of the through hole 3 and the vertex protruding from the inner surface of the through hole 3 for the protruding crystal grain 2a of interest and a straight line is drawn between the exposed parts 2c of the grain boundary phases 2b present on both sides of the protruding crystal grain 2a of interest, the distance from the intersection point between this vertical line and this straight line to the vertex of the protruding crystal grain 2a of interest is 1% or more of the distance from the center line of the through hole 3 to this intersection point.

In this structure, the corrosive gas 7 flowing through the through hole 3 is less prone to make contact with the exposed parts 2c of the grain boundary phases 2b. As a result, the removal of grains caused by corrosion of the exposed parts 2c of the grain boundary phases 2b can be suppressed and generation of particles can be reduced.

In addition, in cross sectional view illustrated in FIG. 3, the portion of the protruding crystal grain 2a which is close to the center of the through hole 3 may have a larger inner diameter than that of the portion of the protruding crystal grain 2a which portion corresponds to the exposed parts 2c. The inner diameter of the portion corresponding to the exposed parts 2c is the same as the straight line described above, that is, the straight line between the exposed parts 2c of the grain boundary phases 2b present on both sides of the protruding crystal grain 2a of interest. In FIG. 3, this indicates the distance between the exposed parts 2c positioned in a B region surrounded by a two-dot chain line. When the structure as described above is achieved, the corrosive gas 7 is less prone to make contact with the exposed parts 2c of the grain boundary phases 2b and corrosion of the exposed parts 2c can be further suppressed.

In addition, as illustrated the A region and the B region surrounded by the two-dot chain lines in FIG. 3, the part of the contour of the protruding crystal grain 2a close to the center of the through hole 3 may have a convex curved surface. When the structure as described above is achieved, the corrosive gas 7 smoothly flows along the inner surface easily as a laminar flow indicated by a dash line arrow in FIG. 3, further suppressing the corrosion of the exposed parts 2c of the grain boundary phases 2b.

In particular, when the protruding crystal grain 2a has the structure in which the portion thereof which is close to the center of the through hole 3 has a larger inner diameter than that of the portion thereof which corresponds to the exposed parts 2c and the part of the contour which is close to the center of the through hole 3 has a convex curved surface, corrosion of the grain boundary phases 2b and the exposed parts 2c can be further suppressed.

Figure 4A:
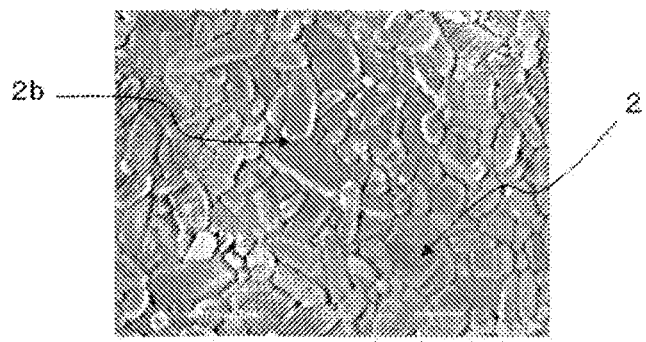
FIGS. 4A to 4C illustrate photographs of the inner surface of the through hole of the shower plate in FIGS. 1A and 1B taken using a scanning electron microscope, wherein FIG. 4A indicates an opening region on an entry side, FIG. 4B indicates a middle region, and FIG. 4C indicates an opening region on an exit side.
Figure 4B:
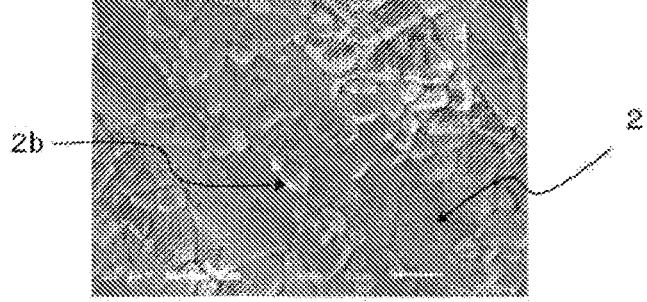
Figure 4C:
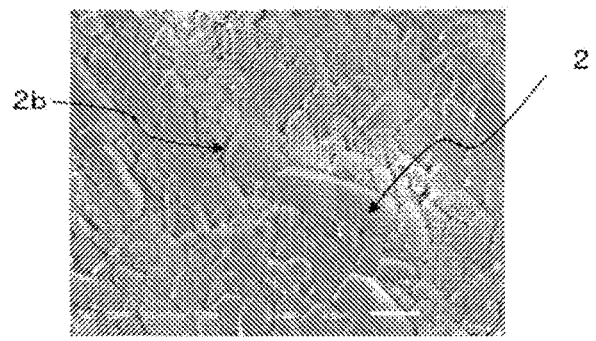

FIGS. 4A to 4C illustrate photographs of the inner surface of the through hole 3 of the shower plate 1 in FIGS. 1A and 1B taken using a scanning electron microscope, wherein FIG. 4A indicates an opening region on an entry side, FIG. 4B indicates a middle region, and FIG. 4C indicates an opening region on an exit side. In the shower plate 1, the entry of the corrosive gas 7 is the upper opening end in FIG. 1B and FIG. 2, and the exit of the corrosive gas 7 is the lower opening end in FIG. 1B and FIG. 2.

The opening region on the entry side begins with the entry side and has the length obtained by dividing the length in the axial direction of the through hole 3 (that is, the distance from the opening end on the entry side to the opening end on the exit side) into five even parts. In addition, the middle region is the middle region of five regions obtained by dividing the length into five even parts. In addition, the opening region on the exit side begins with the exit side and has the length obtained by dividing the length into five even parts.

With respect to the shower plate 1 of the embodiment, the average crystal grain diameter in the middle region corresponding to the middle part in the axial direction of the through hole may be larger than the average crystal grain diameter in the opening region corresponding to the part opened in the first surface 1A of the inner surface of the through hole 3 and the middle region.

When the structure as described above is achieved, in the middle region of the through hole 3 with which the corrosive gas 7 easily makes direct contact, the grain boundary phase 2b surrounding the crystal grain 2 is long since the grain diameter of the crystal grain 2 is large. Accordingly, since the period of time until the grain boundary phase 2b corrodes and the crystal grain 2 removes is prolonged, removal of the crystal grain 2 from the internal surface of the through hole 3 is suppressed.

The average crystal grain diameter of the crystal grains 2 can be obtained by the code method. The average crystal grain diameter can be obtained by, for example, taking an image of the inner surface of the through hole 3 using a scanning electron microscope at 3000-fold magnification, drawing four straight lines having the same length in the range of 40 μm×30 μm, and dividing the number of crystals existing in the four straight lines by the total length of these four straight lines. It should be noted that the length of one straight line may be, for example, 27 μm.

As a result of calculation by the code method above, the average crystal grain diameters of the crystal grains 2 in the photographs in FIGS. 4A, 4B, and 4C are 2.5 μm, 3.1 μm, and 2.4 μm, respectively. In the embodiment, the average crystal grain diameter of the crystal grains 2 in the middle region is larger by 0.6 μm or more, than the average crystal grain diameter in the opening region. It should be noted that, in the embodiment, the average crystal grain diameter is, for example, 1 μm or more and 4 μm or less.

In addition, the shower plate 1 of the embodiment may have an arithmetic average roughness Ra in the axial direction of the through hole 3 of 0.3 μm or more and 0.6 μm or less on the inner surface of the through hole 3. When the structure as described above is achieved, since irregularities on the surfaces of the crystal grains 2 exposed to the through hole 3 are controlled to an appropriate range and corrosive gas smoothly flows along the surfaces of the crystal grains 2 easily, thereby suppressing the partial removal of the crystal grains 2.

The arithmetic average roughness Ra can be obtained according to JIS B 0601: 2013 (ISO 4287: 1997, Amd.1: 2009). When a stylus surface roughness gauge is used for measurement, a stylus having a stylus tip radius of 2 μm is bought into contact with the inner surface of the through hole 3, the scanning speed of the stylus is set to 0.5 mm/second, and the average value at five points obtained by the measurement may be used as the value of arithmetic average roughness Ra.

In addition, in the shower plate 1 of the embodiment, the fluctuation coefficient of the arithmetic average roughness Ra in the axial direction of the inner surface of the through hole 3 may be 0.05 or more and 0.1 or less. When the structure as described above is achieved, since irregularities of the surfaces of the crystal grains 2 exposed to the through hole 3 are controlled to an appropriate range broadly, corrosive gas smoothly flows along the surfaces of the crystal grains 2 easily as a laminar flow, thereby suppressing the partial removal of the crystal grains 2.

It should be noted that the fluctuation coefficient of the arithmetic average roughness Ra is represented as $\sqrt{V}/X$ in which $\sqrt{V}$ denotes the standard deviation of the arithmetic average roughness Ra and X denotes the average value of the arithmetic average roughness Ra.

In addition, in the shower plate 1 of the embodiment, the area ratio of open holes on the inner surface of the through hole 3 may be 1% or less. When the area ratio of open holes is 1% or less, outflow of particles contained in open holes can be reduced.

The area ratio of open holes can be obtained by capturing an image by an optical microscope at 100-fold magnification using a CCD camera and digitizing the image using an image analyzer. For example, the microscope (model: VHX-500) manufactured by Keyence Corporation is used as the optical microscope and digital SIGHT (model: DS-2Mv) manufactured by Nikon Corporation is used as the CCD camera. In addition, the image analyzing software (model: Win ROOF) made by Mitani Corporation can be used to obtain the area ratio of open holes by assuming the circle-equivalent diameter 0.8 μm to be the threshold with respect to the area $9.074 \times 10^3$ pmt.

Although the shower plate 1 of the embodiment has a disc shape as an example in FIGS. 1A and 1B, the shape may be an annular shape, a fan shape, a rectangular plate shape, or the like other than disc shape.

The ceramic sintered body constituting the shower plate 1 of the embodiment may have a relative density of 97% or more. Since the ceramic sintered body is highly dense when this structure is achieved, particles are not easily generated from the whole surface of the ceramic sintered body. The relative density of the ceramic sintered body can be obtained by calculating the apparent density of the ceramic sintered body according to JIS R 1634: 1998 and dividing this apparent density by the theoretical density of the main component constituting the ceramic sintered body.

In the semiconductor manufacturing apparatus using the shower plate 1 of the embodiment in which generation of particles is suppressed, generation of particles can be suppressed, and error in wafer treatment caused by particles can be suppressed.

Next, an example of the method for manufacturing the above-mentioned shower plate 1 of the first embodiment will be described.

First, alumina ($Al_2O_3$) A powder having an average grain diameter of 0.4 to 0.6 μm and alumina ($Al_2O_3$) B powder having an average grain diameter of 1.2 to 1.8 μm are prepared. In addition, silicon oxide ($SiO_2$) powder as a Si source and calcium carbonate ($CaCO_3$) powder as a Ca source are prepared. The silicon oxide powder to be prepared has an average grain diameter of 0.5 μm or less. Magnesium hydroxide ($Mg(OH)_2$) powder is used to obtain an alumina sintered body containing Mg. It should be noted that the powder other than the alumina A powder and the alumina B powder is collectively referred to as first accessory component powder in the following description.

Next, the alumina A powder and the alumina B powder are weighed at the weight ratio of 40:60 to 60:40 to prepare alumina blended powder. Next, each component of the first accessory component powder is weighed by a predetermined amount. The content of Al in terms of $Al_2O_3$ is 99.4 mass % or more with respect to 100 mass % of the components constituting the alumina sintered body.

With respect to the first accessory component powder, the amount of Na in the alumina blended powder is first grasped, the amount of Na is converted to the amount of $Na_2O$ when an alumina sintered body is prepared, and weighing is performed so that the ratio between this converted value and the amount of the oxide converted from the amount of the component (such as Si or Ca in this example) constituting the first accessory component powder is 1.1 or less.

Next, the alumina blended powder and the first accessory component powder, as well as 1 to 1.5 parts by mass of a binder such as PVA (polyvinyl alcohol), 100 parts by mass of a solvent, and 0.1 to 0.55 part by mass of a dispersing agent with respect to 100 parts by mass of the sum of the alumina blended powder and the first accessory component powder, are inputted to an agitator and then mixed and agitated to obtain a slurry.

In place of the first accessory component powder, second accessory component powder containing silicon oxide powder as the Si source, calcium carbonate powder as the Ca source, strontium carbonate ($SrCO_3$) powder or barium carbonate ($BaCO_3$) powder as the Sr source or the Ba source, and magnesium hydroxide powder may be used.

When the alumina blended powder is prepared, with respect to the second accessory component powder, the amount of Na in the alumina blended powder is first grasped, the amount of Na is converted to the amount of $Na_2O$ when an alumina sintered body is prepared. Then, weighing is performed so that the ratio between this converted value and the amount of the oxide converted from the amount of the component (such as Si, Ca, Sr or Ba in this example) constituting the second accessory component powder is 1.1 or less.

Next, the slurry obtained in the above method is sprayed and granulated to obtain granules, and the granules are molded into a predetermined shape by a powder press molding method, an isostatic press molding method (rubber press method), or the like to obtain the first molded body having the A surface which becomes the first surface 1A after sintering and the B surface which faces the A surface and becomes the second surface 1B after sintering. The area ratio of open holes in the inner surface of the through hole 3 can be 1% or less by performing molding using an isostatic press molding method (rubber press method).

Next, a plurality of through holes corresponding to the through holes 3 is formed between the A surface and the B surface of the first molded body using a sintered diamond-made drill.

Next, the first molded body provided with the through holes is placed in a firing furnace and fired at temperature of, for example, 1500° C. or higher and 1700° C. or lower in an air atmosphere to obtain the shower plate 1, comprising a ceramic sintered body, which has the plurality of the through holes 3 is obtained. Although surface treatment such as thermal etching or chemical etching may be applied to the inner surfaces of the through holes 3, machine work is not applied.

By forming through holes in the first molded body by machine work before firing but without performing machine work on the inner surfaces of the through holes 3 after firing to create the inner surfaces of the through holes 3 as so-called burnt surfaces, it is possible to manufacture the shower plate 1 in which the through hole 3 comprises the protruding crystal grains 2a which protrudes more than the exposed parts 2c of the grain boundary phases 2b existing between the crystal grains 2.

In addition, by raising the firing temperature, increasing the firing time, or otherwise to further promote the growth of the crystal grains 2, the crystal grain 2 inflates so as to extrude from the exposed part 2c of the grain boundary phase 2b existing in the border between the crystal grains 2 adjacent to each other, thereby generating the protruding crystal grain 2a which has the portion with a larger inner diameter than that of the portion corresponding to the exposed parts 2c. In addition, the part of the contour of the protruding crystal grain 2a close to the center of the through hole 3 may have a convex curved surface.

When the through hole 3 was mechanically machined in a ceramic sintered body using a drill or the like conventionally, crystal grains on the inner surface of the through hole 3 were mechanically destroyed. As a result, the pressing force between adjacent crystal grains was reduced by cracks and the like caused in crystal grains.

In contrast, in the shower plate 1 of the embodiment, the presence of the protruding crystal grain 2a causes a large compression stress to be applied between the crystal grains 2, thereby suppressing the removal of grains.

It is possible to manufacture the shower plate 1 in which the average crystal grain diameter in the middle region on the inner surface of the through hole 3 is larger than the average crystal grain diameter in the opening region of the through hole 3 by adjusting the arrangement state of the first molded body during firing, the temperature reduction speed condition in the firing process, and the like so that the thermal storage in the middle region is more than the thermal storage in the opening region. The disclosure is not limited to the above embodiment, and various changes, improvements, combinations, and the like are possible without departing from the scope of the disclosure.

Second Embodiment

Figure 5A:
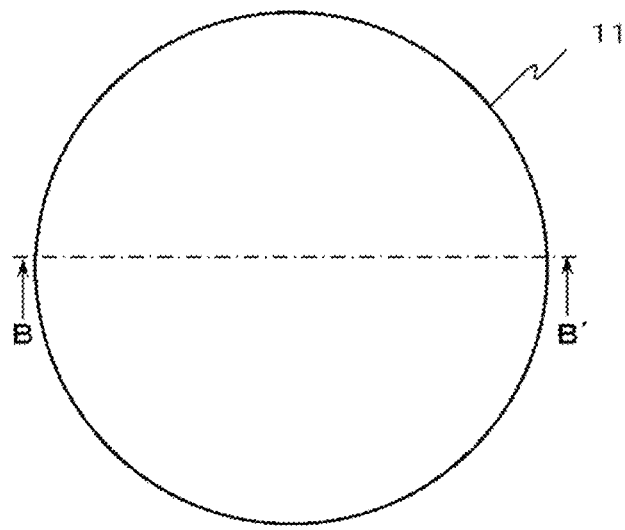
Figure 5B:
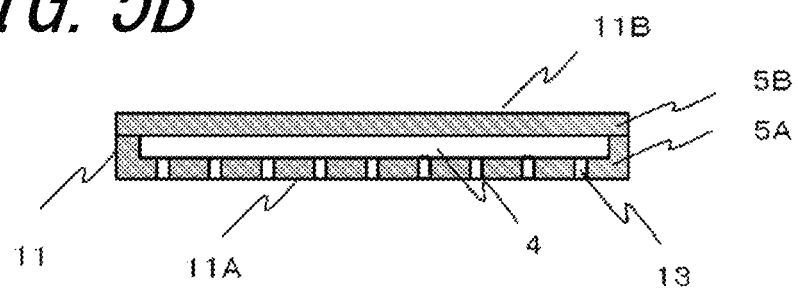

FIGS. 5A and 5B illustrate a shower plate 11 according to a second embodiment, wherein FIG. 5A is a plan view, and FIG. 5B is a cross sectional view taken along the line B-B' in FIG. 5A.

In addition, FIGS. 6A to 8B are drawings for explaining a method for manufacturing the shower plate 11 according to the second embodiment illustrated in FIGS. 5A and 5B.

Figure 6A:
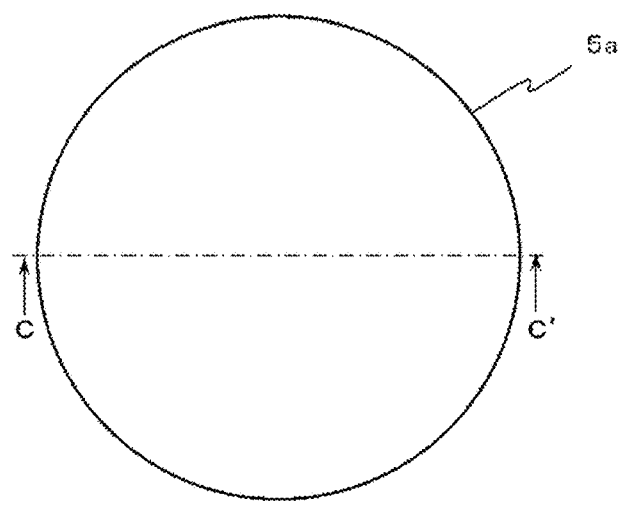
Figure 6B:
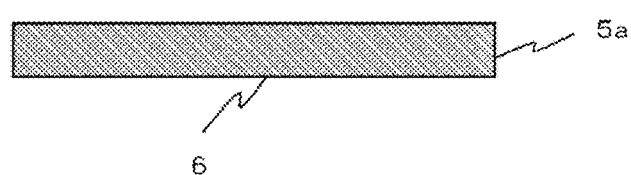
Figure 7A:
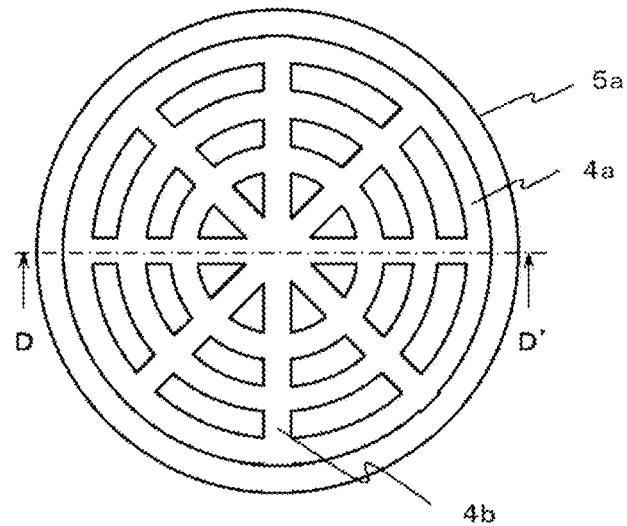
Figure 7B:
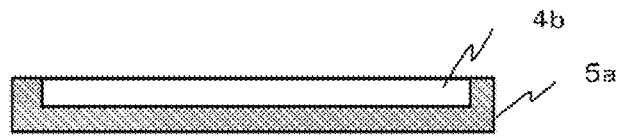
Figure 8A:
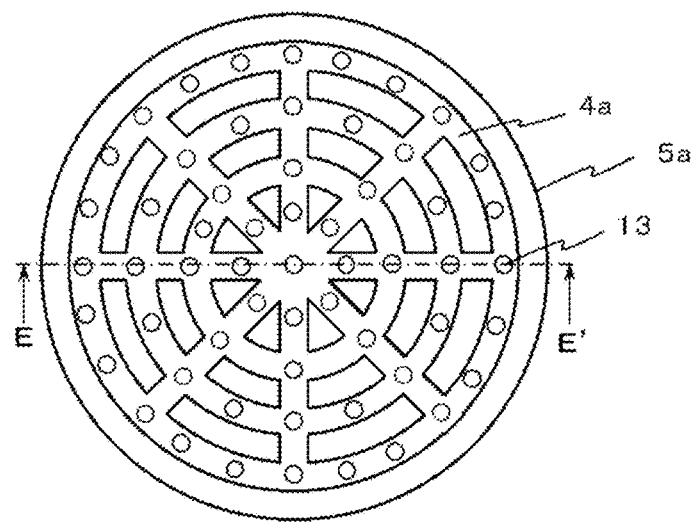
Figure 8B:
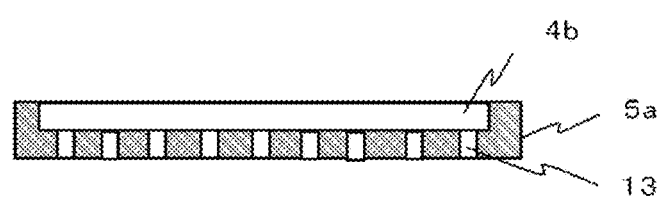

FIG. 6A is a plan view illustrating the second molded body after molding, and FIG. 6B is a cross sectional view taken along the line C-C' in FIG. 6A. FIG. 7A is a plan view illustrating the second molded body in which grooves have been formed, and FIG. 7B is a cross sectional view taken along the line D-D' in FIG. 7A. FIG. 8A is a plan view illustrating the second molded body in which through holes have been further formed, and FIG. 8B is a cross sectional view taken along the line E-E' in FIG. 8A.

The shower plate 11 has a flow passage 4 between a first surface 11A and a second surface 11B. In addition, through holes 13 are positioned between the first surface 11A and the flow passage 4. The through holes 13 are preferably provided substantially orthogonal to the first surface 11A of the shower plate 11. In the semiconductor manufacturing apparatus such as a CVD apparatus or a dry etching apparatus, a fluid such as a corrosive gas supplied via a gas pipe connected to a connection portion (not illustrated) of the shower plate 11 is supplied to the chamber via the flow passage 4 and the through holes 13.

Since the shower plate 11 has the flow passage 4 and the through holes 13, variations in the distribution of the corrosive gas supplied through the through holes 13 can be suppressed. Specifically, for example, a plurality of concentric grooves 4a to be used as the flow passage 4 may be provided as illustrated in FIGS. 7A and 7B and a plurality of radial grooves 4b may be provided so as to intersect the concentric grooves 4a. It should be noted that the shape of the cross section of the flow passage 4 may be a rectangular shape or a shape including a curved surface such as a U-shape or a semicircular shape. The cross sectional area (conductance) of the flow passage 4 may be changed within the shower plate 11. In addition, the flow passage 4 may be formed in a third molded body 5b, which will be described later, in addition to a second molded body 5a. This makes it possible to form the flow passage 4 having a more complicated shape.

In the shower plate 11the inner surfaces of the through holes 13 comprises the protruding crystal grains 2a which protrudes more than the exposed parts 2c of the grain boundary phases 2b existing between the crystal grains 2. In this structure, the corrosive gas 7 flowing through the through holes 13 is less prone to make contact with the exposed parts 2c of the grain boundary phases 2b. As a result, it is possible to suppress the removal of grains caused by corrosion of the exposed parts 2c of the grain boundary phases 2b and reduce the generation of particles.

In addition, as in the inner surfaces of the through holes 13, the inner surface of the flow passage 4 may have the structure in which the protruding crystal grain 2a protrudes more than the exposed parts 2c of the grain boundary phases 2b existing between the crystal grains 2. In this structure, the corrosive gas 7 flowing through the flow passage 4 is less prone to make contact with the exposed parts 2c of the grain boundary phases 2b. As a result, the removal of grains caused by corrosion of the exposed parts 2c of the grain boundary phases 2b can be suppressed also on the inner surface of the flow passage 4 and the generation of particles can be reduced.

In addition, the protruding crystal grain 2a may have the structure in which the portion thereof which is close to the center of the through hole 13 or the flow passage 4 has a larger inner diameter than that of the portion thereof corresponding to the exposed parts 2c. When the structure as described above is achieved, the corrosive gas 7 is less prone to make contact with the exposed parts 2c of the grain boundary phases 2b and corrosion of the exposed parts 2c can be further suppressed.

In addition, the part of the contour of the protruding crystal grain 2a close to the center of the through hole 13 or the flow passage 4 may have a convex curved surface. When this structure is achieved, the corrosive gas 7 smoothly flows along the inner surface easily as a laminar flow, further suppressing the corrosion of the exposed parts 2c of the grain boundary phases 2b.

In particular, when the protruding crystal grain 2a has the structure in which the portion thereof which is close to the center of the through hole 13 or the flow passage 4 has a larger inner diameter than that of the portion thereof corresponding to the exposed parts 2c and the part of the contour close to the center of the through hole 13 or the flow passage 4 has a convex curved surface, the corrosion of the exposed parts 2c of the grain boundary phases 2b can be further suppressed.

The method for manufacturing the shower plate 11 illustrated in FIGS. 5A and 5B will be described in detail below. It should be noted that the method for obtaining granules containing ceramic material powder and the method for molding the molded bodies (second molded body 5a and third molded body 5b) are the same as the method for molding the first molded body described in the shower plate 1, the description is omitted.

FIGS. 6A and 6B are a plan view and a cross sectional view illustrating the second molded body 5a after molding.

The grooves 4a and 4b to be used as the through holes 13 and the flow passage 4 are formed by machining the second molded body 5a. For example, the grooves 4a and 4b to be used as the flow passage 4 are formed in the second molded body 5a as illustrated in FIGS. 7A and 7B by using a sintered diamond-made cutting tool. Next, through holes connected to the grooves 4a and 4b are formed as illustrated in FIGS. 8A and 8B by using a sintered diamond-made cutting tool.

Next, the third molded body 5b is bonded so as to cover the grooves 4a and 4b of the second molded body 5a by using a paste containing ceramic powder to obtain a bonded body having a space to be used as the flow passage 4. A mixture of, for example, ceramic powder and pure water is used as the ceramic paste. The ceramic powder may have the same composition as the ceramic powder used for the second molded body 5a or the third molded body 5b. When the second molded body 5a or the third molded body 5b is formed of alumina, alumina ceramic powder may be used as the ceramic powder.

Next, the obtained bonded body is placed in a firing furnace and heated at, for example, 1500° C. or higher and 1700° C. or lower in an air atmosphere, so that the shower plate 11 having the structure in FIGS. 5A and 5B can be manufactured, in which the flow passage 4 is provided between the first surface 11A and the second surface 11B and the through hole 13 is positioned between the first surface 11A and the flow passage 4.

The shower plate 11 having a desired shape and surface properties may be manufactured by grinding, polishing, and etching the main surface and the end surface of the shower plate 11 after firing. Although the inner surfaces of the through holes 13 may be subjected to surface treatment such as thermal etching or chemical etching, machine work is not applied.

Although the shower plate 11 having the structure illustrated in FIGS. 5A and 5B could not be obtained easily by machine work after firing, since the shower plate 11 is manufactured by performing molding, forming of grooves, forming of through holes, bonding, and firing sequentially in the embodiment, the shower plate 11 can be manufactured relatively easily even when the flow passage 4 has a complicated shape. That is, according to the embodiment, the complicated flow passage 4 can be formed by easy machining in which the surface of the second molded body 5a is cut to form the flow passage 4.

In addition, since machining of the through holes 13 can be performed after machining of the flow passage 4 and before bonding and firing, it is possible to perform the machining of the through holes 13 while checking the position of the flow passage 4 and to manufacture the shower plate 11 with high position accuracy of the flow passage 4 and the through holes 13. In addition, since the same material as in the second molded body 5a and the third molded body is used as a joining material, warping or deformation due to a thermal stress does not occur as compared with joining using different materials and the shower plate 11 having better corrosion resistance can be manufactured as compared with joining using glass, adhesives, or the like.

In addition, when the shower plate 1, 11 as described above is used in the semiconductor manufacturing apparatus, the corrosive gas 7 is less prone to make contact with the exposed parts 2c of the grain boundary phases 2b, and the corrosion of the exposed parts 2c can be further suppressed, thereby reducing the number of particles generated in the semiconductor manufacturing apparatus.

Example

Although an example of the disclosure will be described specifically below, the disclosure is not limited to this example.

Alumina A powder having an average grain diameter of 0.4 μm and alumina B powder having an average grain diameter of 1.6 μm were prepared. In addition, silicon oxide powder as a Si source, calcium carbonate powder as a Ca source, and strontium carbonate powder as a Sr source were prepared. Three types of silicon oxide powder having average grain diameters of 0.5 μm, 3.0 μm, and 5.0 μm were prepared.

Next, the alumina A powder and the alumina B powder were blended at a weight ratio of 50:50. Then, weighing was performed so that the content of Al in terms of $Al_2O_3$ was 99.65 mass % or more with respect to 100 mass % of the components constituting the alumina sintered body to obtain alumina blended powder. The amount of Na in terms of $Na_2O$ with respect to 100 mass % of the components constituting the alumina sintered body was 500 ppm.

Next, the silicon oxide powder having an average grain diameter of 0.5 μm was weighed so as to be 1500 ppm in terms of $SiO_2$ and calcium carbonate powder was weighed so as to be 1500 ppm in terms of CaO.

Next, the alumina blended powder, the silicon oxide powder and the calcium carbonate powder, as well as 1 part by mass of PVA, 100 parts by mass of a solvent, and 0.2 part by mass of a dispersing agent with respect to 100 parts by mass of the sum of the alumina blended powder, the silicon oxide powder and the calcium carbonate powder, were inputted to an agitator and then mixed and agitated to obtain a slurry.

Next, the slurry was sprayed and granulated to obtain granules and the granules were then molded into a predetermined shape by the isostatic press molding method. Next, through holes were formed from the first surface to the second surface of this molded body by a sintered diamond-made drill. Next, the molded body was fired and kept for a predetermined time at the maximum temperature of 1600° C. in an air atmosphere using a firing furnace and shower plates of sample Nos. 1 and 2 were obtained.

For the sample No. 2, the inner peripheral surfaces of the through holes 3 were further ground mechanically by supplying free abrasive particles to a tool to which ultrasonic vibrations were applied.

Then, the sample Nos. 1 and 2 were subjected to cleaning by potassium hydroxide and a surface-active agent, ultrasonic cleaning, acid cleaning, and ultrasonic cleaning sequentially. For the sample No. 1, the inner peripheral surfaces of the through holes 3 were not mechanically machined after firing only the cleaning was performed. That is, the inner surfaces of the through holes 3 of the sample No. 1 is in a state where only the cleaning of the burnt surfaces thereof was performed.

Figure 9:
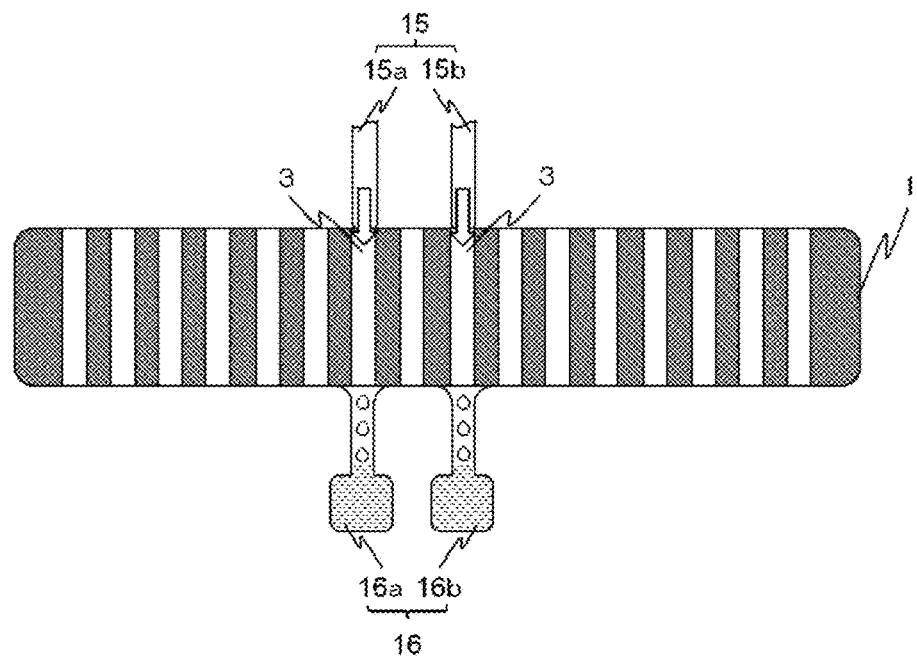
FIG. 9 is a schematic view for explaining a method for measuring the number of particles generated from the shower plate.
Figure 10:
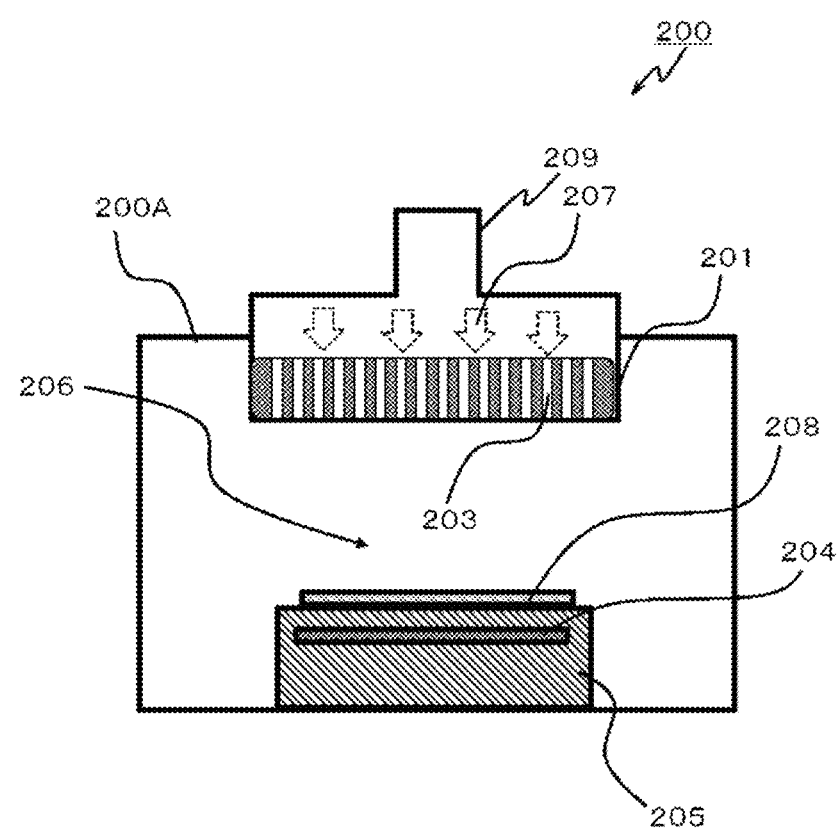
FIG. 10 is a schematic view illustrates an example of a CVD apparatus having a conventional shower plate.
Figure 11A:
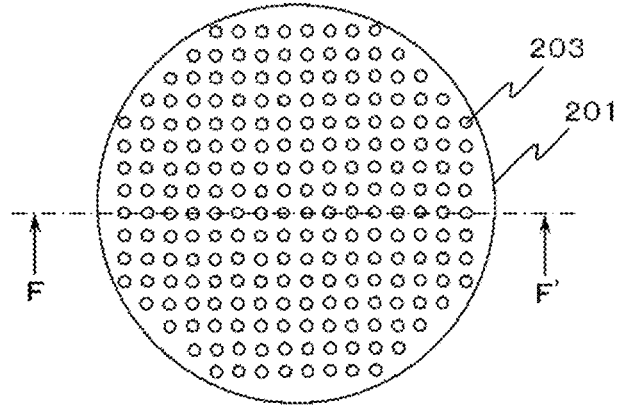
Figure 11B:
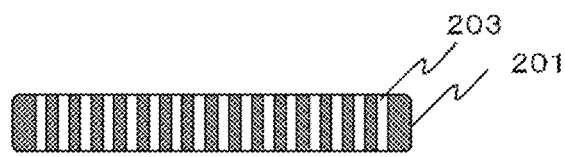
Figure 12:
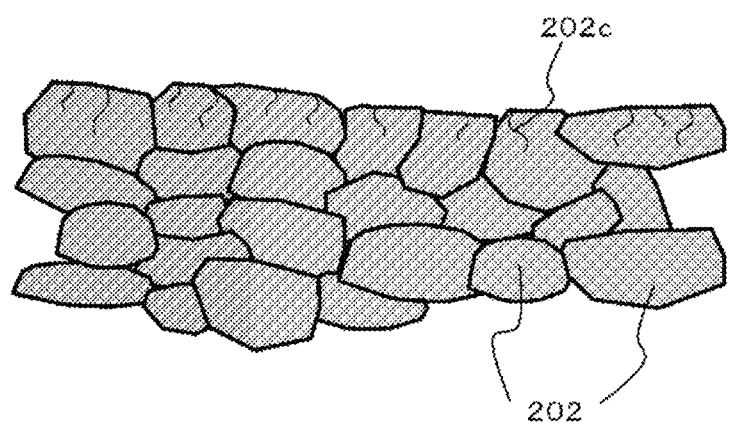
FIG. 12 is an enlarged schematic view illustrating a cross section of an inner surface of a through hole formed by machine work.

Then, as illustrated in the schematic view of FIG. 9 for explaining a method for measuring the number of particles, hoses 15 for supplying pure water were connected to the openings on the supply side of the through holes 3 of each sample, and containers 16 were connected to the exhaust parts on the supply side of the through holes 3 of each sample.

Next, pure water was supplied through the hoses 15 at a flow rate of 5 ml/second for 100 seconds, and the number of particles contained in the pure water exhausted to the containers 16a and 16b was measured by a liquid-borne particle counter (LPC). The result is illustrated in Table 1. It should be noted that only the particles having a diameter of more than 0.2 μm were measured. In addition, the containers 16a and 16b were subjected to ultrasonic cleaning before being connected and were checked to see that the number of particles having a diameter of more than 0.2 μm was 20 or less.

The sample No. 1 was taken along the line A-A' in FIGS. 1A and 1B and was observed using a scanning electron microscope at 3000-fold magnification. As a result, it was confirmed that the exposed portion of each of crystal grains had a projection which protrudes more than the positions of the exposed parts of the grain boundary phases surrounding a crystal grain toward the center line of the through hole.

TABLE 1

| | Number of particles | | |
|---|---|---|---|
| Sample No. | In container 16a | In container 16b | Average value |
| 1 | 500 | 1400 | 950 |
| 2 | 2700 | 3200 | 2950 |

As illustrated in Table 1, it could be confirmed that the number of particles generated from the inner surfaces of the through holes 3 in the sample No. 1 with the through holes 3 having burnt surfaces as the inner surfaces was less than that in the sample No. 2.

REFERENCE SIGNS LIST 1, 11: Shower plate
1A, 11A: First surface
1B, 11B: Second surface
2: Crystal grain
2a: Protruding crystal grain
2b: Grain boundary phase
2c: Exposed part
3, 13: Through hole 4: Flow passage
4a, 4b: Groove
5a: Second molded body
5b: Third molded body
6: C surface
7: Corrosive gas
15: Hose
16: Container
100: CVD apparatus
100A: Chamber
103: Through hole
104: Heater
105: Sample stage
106: Reaction space
108: Wafer
109: Gas pipe

What is claimed is:

1. A shower plate, comprising:
a ceramic sintered body comprising:
    a first surface;
    a second surface facing the first surface; and
    a through hole positioned between the first surface and the second surface,
wherein
an inner surface of the through hole comprising a protruding crystal grain which protrudes more than an exposed part of a grain boundary phase existing between crystal grains, and
the inner surface of the through hole comprises an arithmetic average roughness in an axial direction of the through hole in a range from 0.3 µm to 0.6 µm.

2. The shower plate according to claim 1, wherein
a flow passage is provided between the first surface and the second surface, and
the through hole is positioned between the first surface and the flow passage.

3. The shower plate according to claim 1, wherein
a portion of the protruding crystal grain which is close to a center of the through hole has a larger diameter than that of a portion of the protruding crystal grain which portion corresponds to the exposed part.

4. The shower plate according to claim 1, wherein
a part of a contour of the protruding crystal grain which part is close to a center of the through hole, is convexly curved.

5. The shower plate according to claim 1, wherein
an average crystal grain diameter in a middle region of the inner surface of the through hole which middle region corresponds to a middle part in an axial direction of the through hole, is larger than an average crystal grain diameter in an opening region of the inner surface of the through hole which opening region corresponds to a part opened in the first surface and a middle region of the inner surface of the through hole.

6. A semiconductor manufacturing apparatus, comprising:
the shower plate according to claim 1.

7. A method for manufacturing the shower plate according to claim 1, comprising:
    obtaining granules by granulating a slurry containing ceramic powder;
    obtaining a first molded body by using the granules, the first molded body having an A surface which becomes the first surface, a B surface which faces the A surface and becomes the second surface, and a through hole formed between the A surface and the B surface; and
    obtaining a ceramic sintered body by firing the first molded body,
    the inner surface of the through hole being not mechanically machined after the firing.

8. A method for manufacturing the shower plate according to claim 2, comprising:
    obtaining granules by granulating a slurry containing ceramic powder;
    obtaining a second molded body by using the granules, the second molded body having a C surface which becomes the first surface and a third molded body having a D surface which becomes the second surface;
    forming a groove in a surface opposite to the C surface of the second molded body and forming a through hole between the groove and the C surface of the second molded body;
    obtaining a bonded body by bonding the surface opposite to the C surface of the second molded body to a surface opposite to the D surface of the third molded body via a paste containing the ceramic powder as a main component;
    obtaining a ceramic sintered body by firing the bonded body,
    the inner surface of the through hole being not mechanically machined after the firing.

* * * * *